(12) United States Patent
Chang et al.

(10) Patent No.: US 8,435,638 B2
(45) Date of Patent: May 7, 2013

(54) COATED GLASS AND METHOD FOR MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Jia Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 116 days.

(21) Appl. No.: 13/172,251

(22) Filed: Jun. 29, 2011

(65) Prior Publication Data

US 2012/0196117 A1 Aug. 2, 2012

(30) Foreign Application Priority Data

Jan. 28, 2011 (CN) .......................... 2011 1 0031036

(51) Int. Cl.
*B32B 15/04* (2006.01)
*B32B 17/06* (2006.01)
*C23C 14/08* (2006.01)

(52) U.S. Cl.
USPC ........... 428/432; 428/688; 428/689; 428/697; 428/702; 204/192.1

(58) Field of Classification Search ................. 428/432, 428/688, 689, 697, 702; 204/192.1
See application file for complete search history.

(56) References Cited

U.S. PATENT DOCUMENTS

| 6,777,477 | B1 * | 8/2004 | Niume et al. .................. 524/430 |
| 7,662,431 | B2 * | 2/2010 | Korotkov et al. ........... 427/126.3 |
| 2007/0297966 | A1 * | 12/2007 | Fujimoto et al. .............. 423/305 |
| 2010/0117035 | A1 * | 5/2010 | Korotkov et al. ........... 252/520.1 |
| 2010/0207076 | A1 * | 8/2010 | Fujimoto et al. ........... 252/520.1 |
| 2011/0020664 | A1 * | 1/2011 | Mitose et al. .................. 428/576 |

FOREIGN PATENT DOCUMENTS

| CN | 1925078 | * | 3/2007 |
| JP | 2011084460 | * | 4/2011 |
| TW | 425728 A | * | 3/2001 |

OTHER PUBLICATIONS

Shiu TW-425728 English translation of Abstract.*
Deng CN-1925078 English translation of Abstract.*
Suto JP-2011084460 English machine translation of Document.*
Rastomjee et al. "Investigation of doping of SnO2 by ion implantation and application of ion-implanted films as gas sensors", Thin Solid Films, vol. 279, Issue 1-2, Jun. 1996, p. 98-105.*

* cited by examiner

*Primary Examiner* — Jennifer McNeil
*Assistant Examiner* — Lauren Colgan
(74) *Attorney, Agent, or Firm* — Altis Law Group, Inc.

(57) ABSTRACT

A coated glass includes a substrate and a coating. The coating is deposited on the substrate by vacuum sputtering. The coating is a tin oxide layer co-doped with antimony and bismuth, the molar ratio of tin, antimony, and bismuth is 11-14:1.2-2:0.2-1.5, the coating has a thickness of about 300 nm to about 450 nm.

8 Claims, 2 Drawing Sheets

COATED GLASS AND METHOD FOR MAKING THE SAME

BACKGROUND

1. Technical Field

The present disclosure relates to coated glass, particularly to a coated glass for having a high abrasion resistance property and a method for making the coated glass.

2. Description of Related Art

Low-emissivity glass with coating has a low emissivity in the infrared wavelength range of the radiation spectrum, and has a high transmittance in the visible wavelength range. However, typical films or coatings deposited by vacuum deposition have a low abrasion resistance.

Therefore, there is room for improvement within the art.

BRIEF DESCRIPTION OF THE FIGURE

Many aspects of the coated glass can be better understood with reference to the following figures. The components in the figures are not necessarily drawn to scale, the emphasis instead being placed upon clearly illustrating the principles of the coated glass.

DETAILED DESCRIPTION

Figure 1:
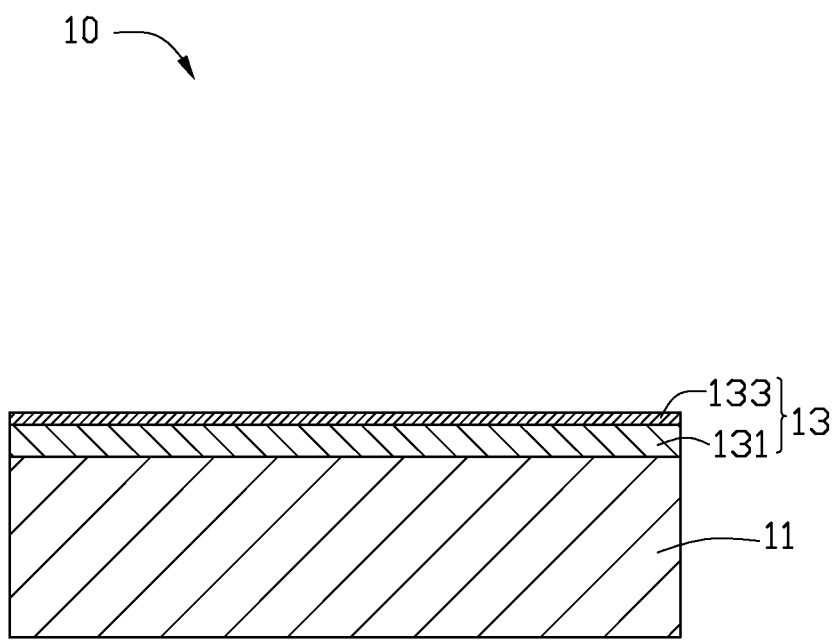
FIG. 1 illustrates a cross-sectional view of an exemplary embodiment of a coated glass.

FIG. 1 shows a coated glass 10 according to an exemplary embodiment. The coated glass 10 includes a glass substrate 11 and a coating 13 deposited on the substrate 11. The coating 13 is a tin oxide ($SnO_2$) layer co-doped with antimony (Sb) and bismuth (Bi). The molar ratio of Sn, Sb and Bi is about 11-14:1.2-2:0.2-1.5. The coating 13 has a thickness of about 300 nm to about 450 nm. The coated glass 10 has a resistivity of about $2 \times 10^{-3}$ ohm-meters (Ω-m) to $4 \times 10^{-3}$ Ω-m. The coated glass 10 has a light transmission rate of about 84% to about 90%.

A method for making the coated glass 10 may include the following steps:

The substrate 11 is pretreated. The pre-treating process may include the following steps:

The substrate 11 is cleaned in an ultrasonic cleaning device (not shown), filled with ethanol absolute, to remove impurities and contaminations, such as grease, or dirt. The cleaning time is about 5 minutes to about 10 minutes.

Figure 2:
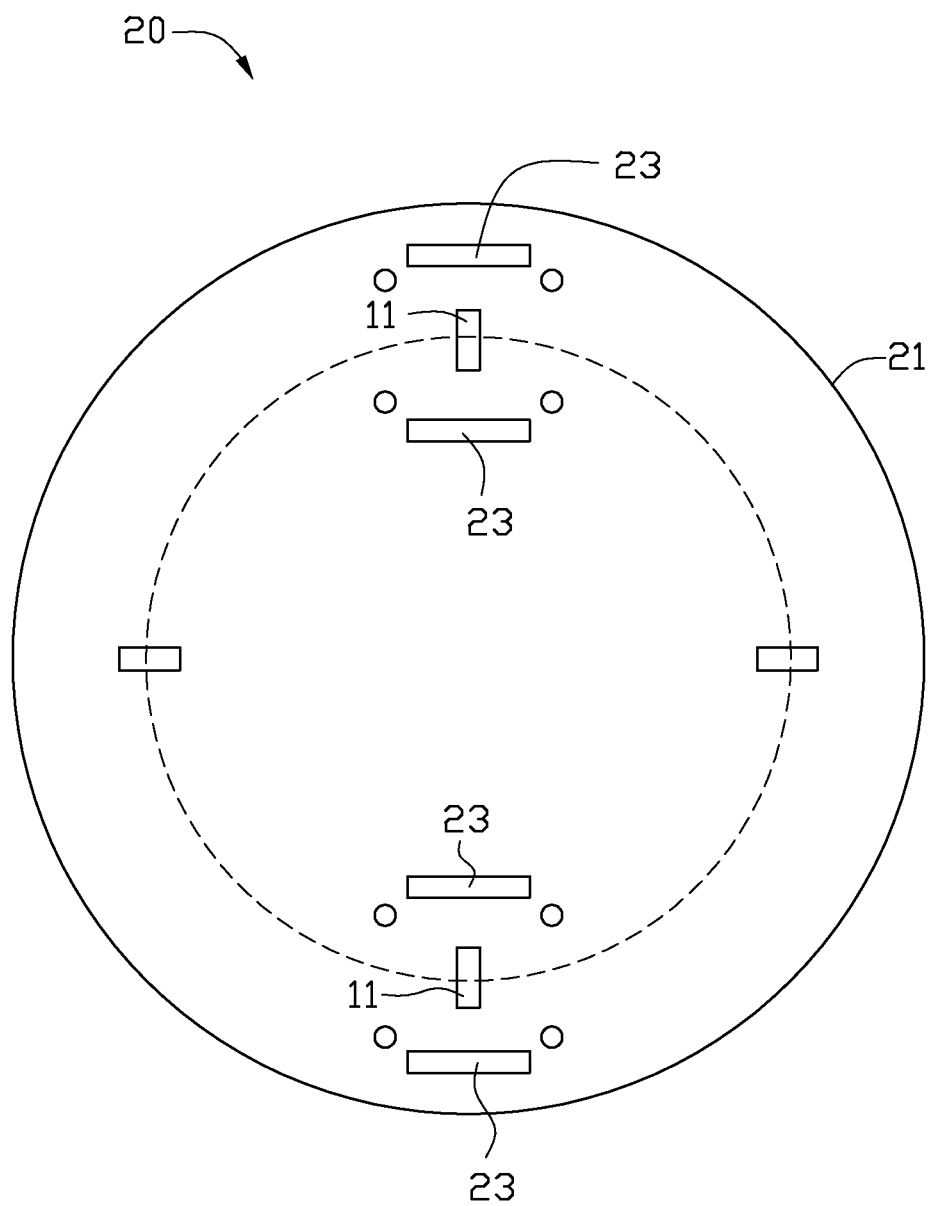
FIG. 2 is a schematic view of a magnetron sputtering coating machine for manufacturing the glass in FIG. 1.

The substrate 11 is plasma cleaned. Referring to FIG. 2, the substrate 11 is positioned in a plating chamber 21 of a vacuum sputtering machine 20. The plating chamber is then evacuated to about $3.0 \times 10^{-3}$ Pa to $5.0 \times 10^{-3}$ Pa. Argon (Ar) may be used as a working gas and be injected into the chamber 21 at a flow rate of about 200 to about 400 standard cubic centimeter per minute (sccm). The substrate 11 may have a negative bias voltage at a range of −200 V to about −300 V, then high-frequency voltage is produced in the plating chamber 21 and the Ar is ionized to plasma. The plasma then strikes the surface of the substrate 11 to clean the surface of the substrate 11. Plasma cleaning the substrate 11 may take about 10 to about 20 minutes. The plasma cleaning process allows the substrate 11 to form a coarse or rugged surface that will enhance the bond between the substrate 11 and the layer on the substrate 11.

The plating chamber 21 is fixed with a target 23 therein. In this exemplary embodiment, the target 23 is made of Sb powder, $SnO_2$ powder, and Bi powder. The process of manufacturing the target 23 includes at least the following steps: mixing $SnO_2$, Sb, Bi powder to form a mixture. The Sn powder has a molar percentage in a range from about 10% to 15%. The $SnO_2$ powder has a molar percentage in a range from about 75% to 85%. The Bi powder has a molar percentage in a range from about 5% to 10%. The mixture is pressed into a blank with a force in a range from about $1.0 \times 10^5$ N to about $2 \times 10^5$ N. The blank is sintered in the furnace at a temperature from about 1000° C. to 1500° C. for about 1 hours to 3 hours.

The coating 13 is vacuum sputtered on the substrate 11. During the process, the inside of the plating chamber 21 is heated from about 200° C. to 250° C. Argon (Ar) as a working gas is adjusted at a flow rate of about 300 sccm to 320 sccm. Oxygen ($O_2$) is used as reaction gas and injected into the chamber at a flow rate of about 60 sccm to 85 sccm. A power of about 5 kw to 8 kw is then applied to the target 23, and the substrate 11 may have negative bias voltage of about −100 V to −150 V to deposit the coating 13 on the substrate 11. Depositing of the coating 13 may take about 35-40 minutes.

The hardness of the above mentioned coated glass 10 will be increased. Since a plurality of free electrons is produced on the coating 13, this will greatly increases the conductivity of the coated glass 10.

The present disclosure is described further in detail using examples as follows, but is not limited by the following examples. All of the embodiments are finished by a vacuum sputtering machine 20. The vacuum sputtering machine 20 is a medium frequency magnetron sputtering device (model No. SM-1100H) manufactured by South Innovative Vacuum Technology Co., Ltd. located in Shenzhen, China. The substrate 11 is made of glass. Plasma cleaning the substrate 11 is with Ar at a flow rate of about 400 sccm. The substrate 11 is biased with −300V negative bias voltage. Plasma cleaning the substrate 11 may take about 10 minutes. In the following examples, the pretreated process for the substrate 11 is similar, and herein is not repeated.

EXAMPLE I

The vacuum sputtering machine 20, the substrate 11 and the target 23 are provided. The target 23 is made of Sb powder, $SnO_2$ powder, and Bi powder. The process of manufacturing the target 23 includes at least the following steps: mixing $SnO_2$, Sb, Bi powder to form a mixture. The mixture is pressed into a blank at a force in a range from about $1.0 \times 10^5$ N to $2 \times 10^5$ N. The blank is sintered in the furnace at a temperature of 1500° C. for about 1.5 hours. The coating 13 is vacuum sputtered on the substrate 11 according to the parameters shown in TABLE 1.

TABLE 1

| Example I | Target (molar percentage) | Power (kw) | Ar (sccm) | $O_2$ (sccm) | bias voltage (V) | T (° C.) | Time (minutes) | Thickness (nm) |
| --- | --- | --- | --- | --- | --- | --- | --- | --- |
| coating 13 | 10% Sb, 85% $SnO_2$, 5% Bi | 5 | 300 | 85 | −100 | 250 | 40 | 376 |

The coated glass 10 obtained from the first embodiment has a resistivity of about $3.88 \times 10^{-3}$ Ω-m. The coated glass 10 has a light transmission rate of about 88.1%. The coating 13 is a $SnO_2$ layer co-doped with Sb and Bi. The molar ratio of Sn, Sb and Bi is 13.35:1.5:0.78.

EXAMPLE II

The vacuum sputtering machine 20, the substrate 11 and the target 23 are provided. The target 23 is made of Sb powder, $SnO_2$ powder, and Bi powder. The process of manufacturing the target 23 includes at least the following steps: mixing $SnO_2$, Sb, Bi powder to form a mixture. The mixture is pressed into a blank at a force in a range from about $1.0 \times 10^5$ N to $2 \times 10^5$ N. The blank is sintered in the furnace at a temperature of 1050° C. for about 1.5 hours. The coating 13 is vacuum sputtered on the substrate 11 according to the parameters shown in TABLE 2.

TABLE 2

| Example II | Target (molar percentage) | Power (kw) | Ar (sccm) | $O_2$ (sccm) | bias voltage (V) | T (° C.) | Time (minutes) | Thickness (nm) |
|---|---|---|---|---|---|---|---|---|
| coating 13 | 15% Sb, 75% $SnO_2$, 10% Bi | 5 | 300 | 65 | −100 | 200 | 40 | 376 |

The coated glass 10 obtained from the second embodiment has a resistivity of about $2 \times 10^{-3}$ Ω-m. The coated glass 10 has a light transmission rate of about 86%.

The coating 13 is a $SnO_2$ layer co-doped with Sb and Bi. The molar ratio of Sn, Sb and Bi is 12.6:1.7:1.28.

EXAMPLE III

The vacuum sputtering machine 20, the substrate 11 and the target 23 are provided. The target 23 is made of Sb powder, $SnO_2$ powder, and Bi powder. The process of manufacturing the target 23 may include at least the following steps: mixing $SnO_2$, Sb, Bi powder to form a mixture. The mixture is pressed into a blank at a press force in a range from about $1.0 \times 10^5$ N to about $2 \times 10^5$ N. The blank is sintered at a temperature in the furnace of 1150° C. for about 2 hours. The coating 13 is vacuum sputtered on the substrate 11 according to the parameters shown in TABLE 3.

TABLE 3

| Example III | Target (molar percentage) | Power (kw) | Ar (sccm) | $O_2$ (sccm) | bias voltage (V) | T (° C.) | Time (minutes) | Thickness (nm) |
|---|---|---|---|---|---|---|---|---|
| coating 13 | 12% Sb, 82% $SnO_2$, 6% Bi | 7 | 300 | 70 | −100 | 220 | 40 | 312 |

The coated glass 10 achieved from the first embodiment has a resistivity of about $3 \times 10^{-3}$ Ω-m. The coated glass 10 has a light transmission rate of about 88%. The coating 13 is a $SnO_2$ layer co-doped with Sb and Bi. The molar ratio of Sn, Sb and Bi is 13.3:1.81:0.92.

EXAMPLE IV

The vacuum sputtering machine 20, the substrate 11 and the target 23 are provided. The target 23 is made of Sb powder, $SnO_2$ powder, and Bi powder. The process of manufacturing the target 23 may include at least the following steps: mixing $SnO_2$, Sb, Bi powder to form a mixture. The mixture is pressed into a blank at a press force in a range from about $1.0 \times 10^5$ N to about $2 \times 10^5$ N. The blank is sintered at a temperature in the furnace of 1350° C. for about 2.5 hours. The coating 13 is vacuum sputtered on the substrate 11 according to the parameters shown in TABLE 4.

TABLE 4

| Example IV | Target (molar percentage) | Power (kw) | Ar (sccm) | O$_2$ (sccm) | bias voltage (V) | T (° C.) | Time (minutes) | Thickness (nm) |
|---|---|---|---|---|---|---|---|---|
| coating 13 | 12% Sb, 80% SnO$_2$, 8% Bi | 7 | 300 | 80 | −100 | 250 | 40 | 394 |

The coated glass 10 achieved from the first embodiment has a resistivity of about 2.45×10$^{-3}$ Ω-m. The coated glass 10 has a light transmission rate of about 86.1%. The coating 13 is a SnO$_2$ layer co-doped with Sb and Bi. The molar ratio of Sn, Sb and Bi is 13.3:1.63:0.58.

EXAMPLE V

The vacuum sputtering machine 20, the substrate 11 and the target 23 are provided. The target 23 is made of Sb powder, SnO$_2$ powder, and Bi powder. The process of manufacturing the target 23 may include at least the following steps: mixing SnO$_2$, Sb, Bi powder to form a mixture. The mixture is pressed into a blank at a press force in a range from about 1.0×10$^5$ N to about 2×10$^5$ N. The blank is sintered at a temperature in the furnace of 1200° C. for about 1.5 hours. The coating 13 is vacuum sputtered on the substrate 11 according to the parameters shown in TABLE 5.

TABLE 5

| Example V | Target (molar percentage) | Power (kw) | Ar (sccm) | O$_2$ (sccm) | bias voltage (V) | T (° C.) | Time (minutes) | Thickness (nm) |
|---|---|---|---|---|---|---|---|---|
| coating 13 | 9% Sb, 84% SnO$_2$, 8% Bi | 7.5 | 300 | 65 | −100 | 230 | 40 | 349 |

The coated glass 10 achieved from the first embodiment has a resistivity of about 3.52×10$^{-3}$ Ω-m. The coated glass 10 has a light transmission rate of about 88%. The coating 13 is a SnO$_2$ layer co-doped with Sb and Bi. The molar ratio of Sn, Sb and Bi is 13:1.41:0.48.

EXAMPLE VI

The vacuum sputtering machine 20, the substrate 11 and the target 23 are provided. The target 23 is made of Sb powder, SnO$_2$ powder, and Bi powder. The process of manufacturing the target 23 may include at least the following steps: mixing SnO$_2$, Sb, Bi powder to form a mixture. The mixture is pressed into a blank at a press force in a range from about 1.0×10$^5$ N to about 2×10$^5$ N. The blank is sintered at a temperature in the furnace of 1100° C. for about 1.5 hours. The coating 13 is vacuum sputtered on the substrate 11 according to the parameters shown in TABLE 5.

TABLE 6

| Example VI | Target (molar percentage) | Power (kw) | Ar (sccm) | O$_2$ (sccm) | bias voltage (V) | T (° C.) | Time (minutes) | Thickness (nm) |
|---|---|---|---|---|---|---|---|---|
| coating 13 | 10% Sb, 80% SnO$_2$, 10% Bi | 6.5 | 300 | 75 | −100 | 200 | 40 | 387 |

The coated glass 10 achieved from the first embodiment has a resistivity of about 3×10$^{-3}$ Ω-m. The coated glass 10 has a light transmission rate of about 88.4%. The coating 13 is a SnO$_2$ layer co-doped with Sb and Bi. The molar ratio of Sn, Sb and Bi is 12.6:1.34:1.27.

In an alternative embodiment, the target 23 may be made of Sb powder, Sn powder, and Bi powder. The process of manufacturing the target 23 may include at least the following steps: mixing SnO$_2$, Sb, Bi powder to form a mixture. The Sn powder has a molar percentage in a range from about 10% to 15%. The Sb powder has a molar percentage in a range from about 75% to 85%. The Bi powder has a molar percentage in a range from about 5% to 10%. The mixture is pressed into a blank at a press force in a range from about 0.8×10$^5$ N to about 2×10$^5$ N. The blank is sintered at a temperature in the furnace from about 800° C. to about 1350° C. for about 1 hours to about 3 hours.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated glass, comprising:
   a substrate; and
   a coating deposited on the substrate, the coating being a tin oxide layer co-doped with antimony and bismuth;
   wherein the molar ratio of tin, antimony, and bismuth is 11-14:1.2-2:0.2-1.5, the coating has a thickness of about 300 nm to about 450 nm.

2. The coated glass as claimed in claim 1, wherein the coating is formed by magnetron sputtering process with a target, the target is made of Sb powder, SnO$_2$ powder, and Bi powder, the Sb powder has a molar percentage in a range from about 10% to 15%, the SnO$_2$ powder has a molar percentage in a range from about 75% to 85%, the Bi powder has a molar percentage in a range from about 5% to 10%.

3. The coated glass as claimed in claim 1, wherein the coated glass has a resistivity of about $2\times10^{-3}$ ohm-meters ($\Omega$-m) to $4\times10^{-3}$ $\Omega$-m, the coated glass has a light transmission rate of about 84% to about 90%.

4. A method for manufacturing a coated glass comprising steps of:
providing a substrate;
providing a vacuum sputtering coating machine comprising a plating chamber and a target located in the plating chamber, the target made of Sb powder, $SnO_2$ powder, and Bi powder, the Sb powder has a molar percentage in a range from about 10% to 15%, the $SnO_2$ powder has a molar percentage in a range from about 75% to 85%, the Bi powder has a molar percentage in a range from about 5% to 10%;
depositing a coating on the substrate by evaporation of the target by magnetron sputtering process in the vacuum sputtering coating machine, the coating being a tin oxide layer co-doped with antimony and bismuth, the molar ratio of tin, antimony, and bismuth is 11-14:1.2-2:0.2-1.5, the coating has a thickness of about 300 nm to about 450 nm.

5. The method as claimed in claim 4, further comprising a step of pre-treating the substrate before forming the first conductive layer.

6. The method as claimed in claim 5, wherein the pre-treating process comprising ultrasonic cleaning the substrate and plasma cleaning the substrate.

7. The method as claimed in claim 6, wherein the coated glass has a resistivity of about $2\times10^{-3}$ ohm-meters ($\Omega$-m) to $4\times10^{-3}$ $\Omega$-m, the coated glass has a light transmission rate of about 84% to about 90%.

8. The method as claimed in claim 6, wherein vacuum sputtering the coating use Argon which is injected at a flow rate of about 300 to about 400 sccm, oxygen is injected at a flow rate of about 50 sccm to about 88 sccm, power of about 5 kw to about 7 kw is applied to the first target, and the substrate is biased with negative bias voltage of about $-100$ V to about $-150$ V, and depositing of the first conductive layer and the second conductive layer respectively take about 30-60 minutes.

* * * * *